US010608440B2

(12) United States Patent
Mishrikey

(10) Patent No.: US 10,608,440 B2
(45) Date of Patent: Mar. 31, 2020

(54) CONTROL CIRCUIT CONFIGURED TO DETERMINE WHEN A DIRECT CURRENT COMPONENT IN AN ALTERNATING CURRENT POWER LINE PASSES A DESIGNATED THRESHOLD

(71) Applicant: TYCO ELECTRONICS CORPORATION, Berwyn, PA (US)

(72) Inventor: Matthew Mishrikey, Roslindale, MA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 423 days.

(21) Appl. No.: 15/252,303

(22) Filed: Aug. 31, 2016

(65) Prior Publication Data

US 2018/0062396 A1    Mar. 1, 2018

(51) Int. Cl.
| | | |
|---|---|---|
| *H02J 5/00* | (2016.01) | |
| *G01R 19/165* | (2006.01) | |
| *H02H 3/50* | (2006.01) | |
| *H02H 3/33* | (2006.01) | |

(52) U.S. Cl.
CPC .............. *H02J 5/00* (2013.01); *G01R 19/165* (2013.01); *H02H 3/332* (2013.01); *H02H 3/50* (2013.01)

(58) Field of Classification Search
CPC ........... H02J 5/00; G01R 19/65; H02H 3/332; H02H 3/50
USPC ....................................................... 307/131
See application file for complete search history.

(56) References Cited

U.S. PATENT DOCUMENTS

| | | | |
|---|---|---|---|
| 4,356,525 A | | 10/1982 | Komrumpf et al. |
| 4,500,837 A | * | 2/1985 | Shuey ..................... H02H 3/50 |
| | | | 324/102 |
| 4,556,842 A | | 12/1985 | Rosswurm |
| 5,060,166 A | | 10/1991 | Engel et al. |
| 6,577,737 B1 | | 6/2003 | Krochmal et al. |

(Continued)

FOREIGN PATENT DOCUMENTS

WO     2011089421 A1    7/2011

OTHER PUBLICATIONS

L. Bowtell and A. Ahfock; A DC Offset Controller for Transformer-less Single Phase Photovoltaic Grid-connected Inverters; 26 pages; 2010.

(Continued)

*Primary Examiner* — Rexford N Barnie
*Assistant Examiner* — Swarna N Chowdhuri

(57) ABSTRACT

Control circuit includes a current sensor that is configured to detect alternating current transmitted through a power line. The alternating current includes an alternating current (AC) component and a direct current DC offset component. The control circuit also includes a filter sub-circuit that is configured to receive a sensor output from the current sensor that is representative of the AC component and the DC component. The AC component has a frequency higher than a frequency of the DC component. The filter sub-circuit is configured generate a DC output that is based on the DC component. The control circuit also includes an analysis sub-circuit that is configured to receive the DC output and determine that the DC output has passed a designated threshold. The analysis sub-circuit is configured to trip a relay or output a signal when the DC output passes the designated threshold.

20 Claims, 5 Drawing Sheets

(56) References Cited

U.S. PATENT DOCUMENTS

| | | | |
|---|---|---|---|
| 7,863,828 B2 | 1/2011 | Melanson | |
| 2008/0106831 A1* | 5/2008 | Lewinski | H02H 3/335 361/42 |
| 2012/0281606 A1* | 11/2012 | Cooney | E06B 9/32 370/311 |
| 2015/0228407 A1 | 8/2015 | Takenaka | |
| 2015/0293154 A1* | 10/2015 | Wallace | G01R 15/22 324/97 |
| 2015/0380923 A1* | 12/2015 | Ukil | H02H 3/083 361/93.1 |

OTHER PUBLICATIONS

International Search Report, Application No. PCT/IB2017/055179, International Filing Date, Aug. 29, 2017.

* cited by examiner

CONTROL CIRCUIT CONFIGURED TO DETERMINE WHEN A DIRECT CURRENT COMPONENT IN AN ALTERNATING CURRENT POWER LINE PASSES A DESIGNATED THRESHOLD

BACKGROUND

The subject matter relates generally to controlling alternating current power lines.

Alternating current power lines convey power from a power supply to a load. Circuit breakers (or relays) are often used to control the power that is supplied to the load. The current flowing through the power line is primarily alternating current (AC), but some unwanted DC current (called DC offset) may appear along the power line. For example, one or more fault events may occur that inject a DC offset current into the power line. Depending on different factors, the DC offset current may cause unnecessary power consumption, load failure, continuous arc faulting, mechanical and/or thermal stresses, or other unwanted circuit conditions. It may be desirable to break the circuit and/or notify an operator when the DC offset current passes a designated threshold.

BRIEF DESCRIPTION

In an embodiment, a control circuit is provided that is configured to monitor an alternating current power line. The control circuit includes a current sensor that is configured to detect alternating current transmitted through a power line. The alternating current of the power line includes an alternating current (AC) component and a direct current DC offset component. The control circuit also includes a filter sub-circuit that is configured to receive a sensor output from the current sensor that is representative of the AC component and the DC component. The filter sub-circuit is configured to block the AC component and generate a DC output that is based on the DC component. The control circuit also includes an analysis sub-circuit that is configured to receive the DC output from the filter sub-circuit and determine that the DC output from the filter sub-circuit has passed a designated threshold. The analysis sub-circuit is configured to trip a relay or output a signal when the DC output from the filter sub-circuit passes the designated threshold.

In some aspects, the control circuit may be configured to operate in a standard mode and also in an emergency mode. The designated threshold may be smaller for the standard mode than the emergency mode such that certain fault events are ignored when the control circuit is operating in the emergency mode.

In some aspects, the control circuit may also include a reconditioning sub-circuit that is configured to modify the DC output from the filter sub-circuit prior to the DC output being received by the analysis sub-circuit. Optionally, the control circuit may be configured to operate in a standard mode and in an emergency mode. The reconditioning sub-circuit may modify the DC output in a first manner during the standard mode and modify the DC output in a second manner during the emergency mode. The DC output being modified in the emergency mode such that certain fault events are ignored when the control circuit is operating in the emergency mode.

In an embodiment, a system is provided that includes an alternating current power line that is configured to convey power from a power supply to a load. The system also includes a circuit breaker and a control circuit that is configured to monitor the alternating current power line. The control circuit includes a current sensor that is configured to detect alternating current transmitted through a power line. The alternating current of the power line includes an alternating current (AC) component and a direct current DC offset component. The control circuit also includes a filter sub-circuit that is configured to receive a sensor output from the current sensor that is representative of the AC component and the DC component. The filter sub-circuit is configured to block the AC component and generate a DC output that is based on the DC component. The control circuit also includes an analysis sub-circuit that is configured to receive the DC output from the filter sub-circuit and determine that the DC output from the filter sub-circuit has passed a designated threshold. The analysis sub-circuit is also configured to trip the circuit breaker or generate an output signal to an operator when the DC output from the filter sub-circuit passes the designated threshold.

In an embodiment, a method is provided that includes monitoring an alternating current power line that conveys power to a load. The method also includes detecting an alternating current (AC) component and a direct current (DC) offset component in the alternating current. The method also includes generating a sensor output that is representative of the AC component and the DC component. The AC component has a higher frequency than a frequency of the DC component. The method also includes filtering the sensor output by blocking the AC component and generating a DC output that is based on the DC component. The method also includes determining that the DC output has passed a designated threshold. The method also includes tripping a relay or outputting a signal when the DC output passes the designated threshold.

In some aspects, the method may also include switching from a standard mode to an emergency mode. The designated threshold during the standard mode may be smaller than the designated threshold during the emergency mode such that certain fault events are ignored in the emergency mode.

In some aspects, the method may also include modifying the DC output prior to determining the DC output has passed the designated threshold. Optionally, the method includes switching from a standard mode to an emergency mode. The DC output is modified in a first manner during the standard mode and modified in a different second manner during the emergency mode. The DC output is modified in the emergency mode such that certain fault events are ignored when the control circuit is operating in the emergency mode.

DETAILED DESCRIPTION

Figure 1:
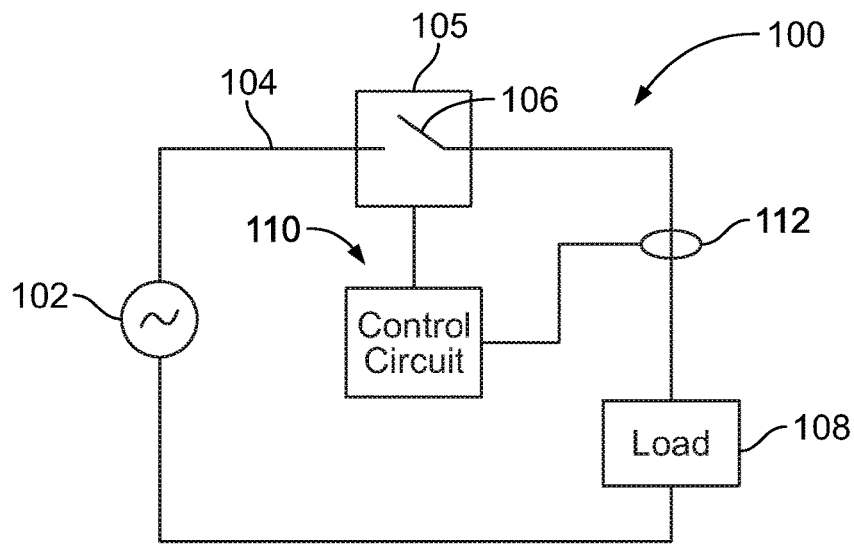
FIG. 1 is a schematic representation of a system in accordance with one embodiment.

FIG. 1 is a schematic representation of a system 100 in accordance with one or more embodiments. The system 100 includes a power supply 102, a power line 104, a circuit breaker 105 having one or more contactors 106, and a load 108. The power supply 102 is configured to convey power to the load 108 through the power line 104 and the contactor (s) 106. The system 100 also includes a control circuit 110 having a current sensor 112. The control circuit 110 is configured to control the circuit breaker 105 and/or communicate with an operator (not shown). For example, the control circuit 110 may communicate with a computing system and/or an individual (e.g., through a user interface or control panel). In some embodiments, the current sensor 112 is a Hall Effect sensor, but the current sensor 112 may be other sensors that are capable of detecting current through the power line 104. Optionally, the system 100 may be configured as a three-phase power generation, transmission, or distribution system. For example, the system 100 may include a three-phase solar inverter. The AC output may be generated by switching the DC power provided by solar panels. Issues in this inversion process could lead to an undesired DC offset in the AC output. As another example, the system 100 may include a three-phase motor (or load) that is connected to three-phase power. A three-phase contactor may be in between the power source and the motor.

The load 108 may be, for example, a mechanical device (e.g., motor) or optical device (e.g., light bulb). In some embodiments, the load 108 is a device of a larger system, such as an automobile or aircraft. The load 108 may include a number of devices that are fed by the power line 104.

As described below, the control circuit 110 is configured to monitor the current flowing through the power line 104. The control circuit 110 may monitor the power line 104 by continuously or repeatedly detecting a DC component of the alternating current at the current sensor 112. The DC component is representative of the DC offset current that may be injected into the power line 104, such as when one or more fault events occur, including a failure event. A DC offset may also occur if the larger circuit is improperly designed or miscalibrated or if one or more circuit components degrade. A DC offset may also be caused by external events, such as geomagnetically induced currents (GIC) or an electromagnetic pulse (EMP). A DC offset may also occur due to user error or improper inputs by the user.

If the DC component passes a designated threshold, the control circuit 110 may break the circuit by, for example, disengaging the contactor 106 of the circuit breaker 105. Alternatively or in addition to breaking the circuit, the control circuit 110 may communicate a signal to an operator so that the operator is aware that the DC component has passed the threshold. The operator may be a computing system or a human. As such, unwanted circuit conditions may be avoided and/or may be considered by the operator.

As used herein, the phrase "passes a designated threshold" and like phrases means that a monitored characteristic (e.g., the DC component) has satisfied a predetermined condition. For example, the DC component may pass a designated threshold when a value that represents the DC component has exceeded a predetermined upper value, when the value that represents the DC component has fallen below a predetermined lower value, or when the value that represents the DC component is within a predetermined range. As used herein, a value "represents the DC component" or "is based on the DC component" when the value correlates directly to the DC component (e.g., the value is the DC component, is a factor of the DC component, or a fraction of the DC component) or when the value is a function of the DC component. For example, in some cases, a predetermined algorithm that includes the DC component may be used to introduce others variables or non-linearities into the decision-making of the control circuit 110.

The value that represents the DC component or is based on the DC component may be referred to as a DC output. In some cases, the DC output may be modified after a stage in order to, for example, facilitate analysis or make the control circuit more robust.

In some embodiments, the control circuit 110 is configured to operate in a plurality of operating modes. For example, a first operating mode may be a standard mode and a second operating mode may be an emergency mode. The designated thresholds for the DC component may be different in the standard and emergency modes. For instance, the emergency mode may permit one or more fault events to occur without breaking the circuit of the power line, but the circuit may be broken when these fault events occur during the standard mode.

The control circuit 110 may switch between operating modes based on a control signal from the operator. For example, the user may physically flip a switch to change to the thresholds or conditions for tripping. Alternatively, a computing system may identify that the operating mode should be switched and send a control signal to the control circuit 110 to change the thresholds or conditions for tripping. The computing system may be hardwired (e.g., analog or digital circuit) for this decision-making or have a processing unit (e.g., microprocessor) that makes the decision.

In some embodiments, the control circuit 110 may analyze the DC component to identify which fault event or fault events have occurred. For example, the control circuit 110 may determine that a certain event (or events) has occurred based on the value of the DC component. This analysis may be performed in any operating mode and may occur before or after the DC component passes the designated threshold. Upon identifying the certain event, the control circuit 110 may communicate the identified events to the operator. Alternatively, the control circuit 110 may communicate the DC component to the operator.

Figure 2:
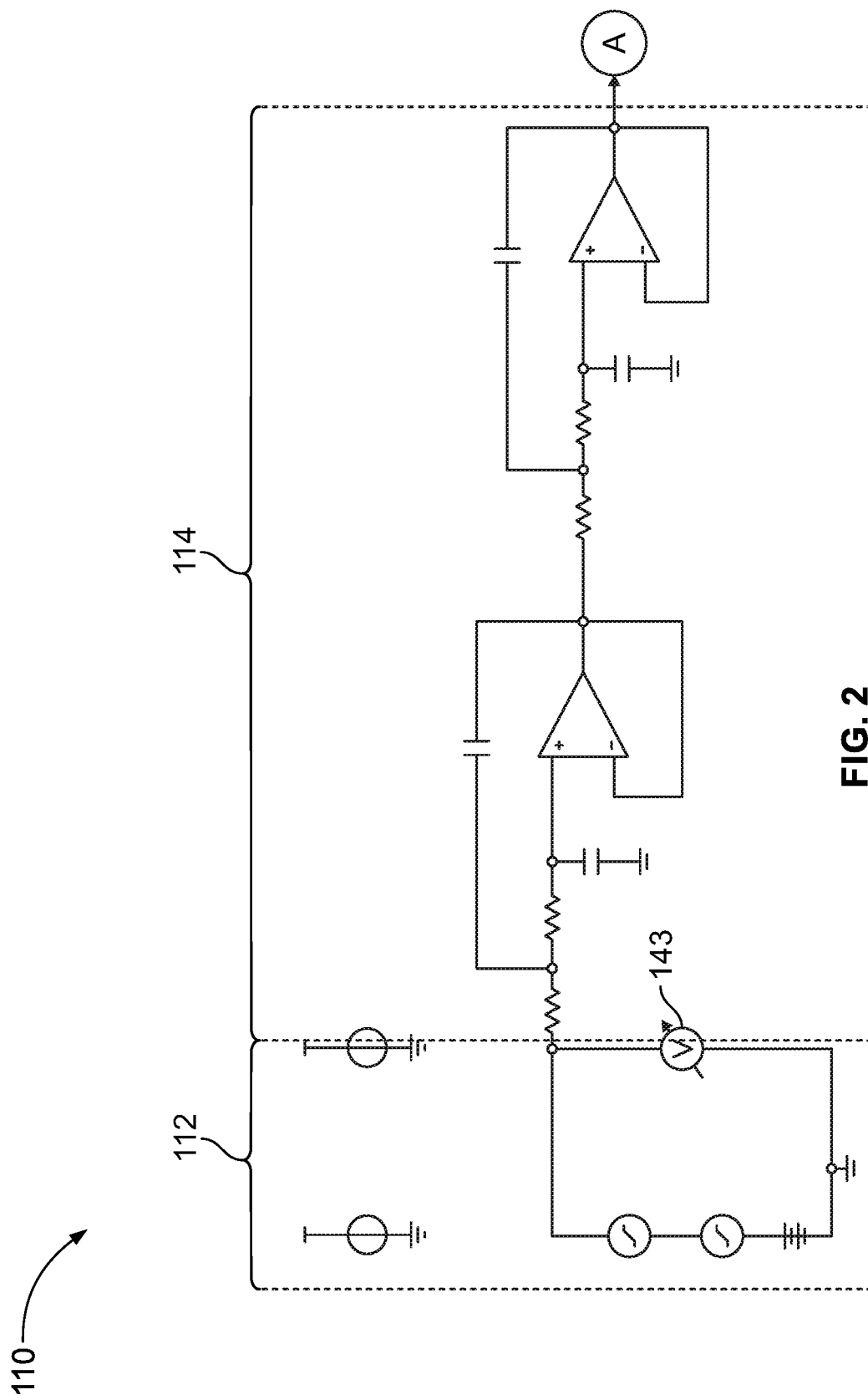
FIG. 2 illustrates a portion of a control circuit that may be used with the system of FIG. 1 including a current sensor and a re-conditioning sub-circuit.
Figure 3:
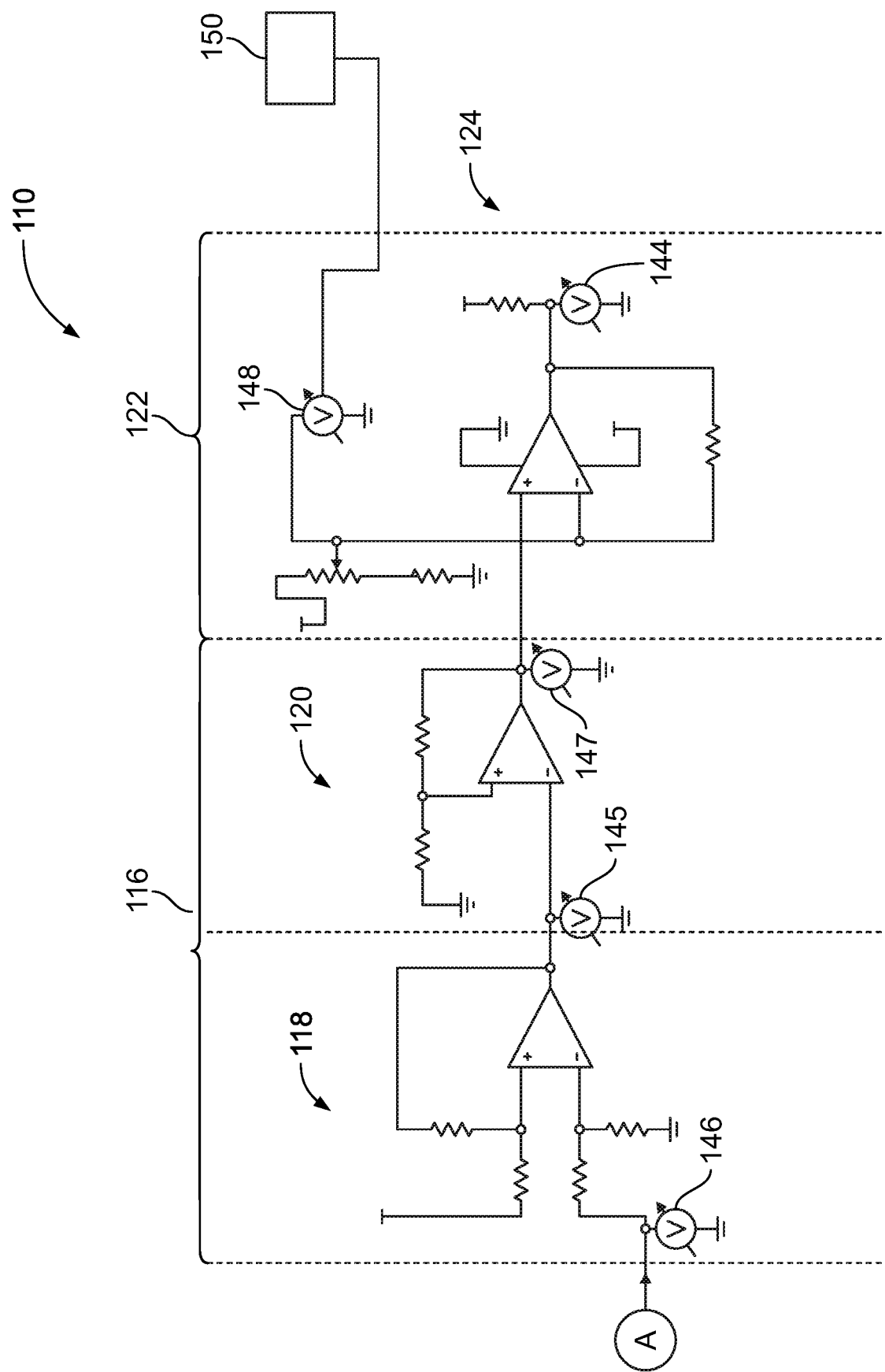
FIG. 3 illustrates another portion of the control circuit that may be used with the system of FIG. 1 including an analysis sub-circuit.

FIGS. 2 and 3 illustrate a control circuit 110 in greater detail. Only a portion of the control circuit 110 is shown in FIG. 2 and a different portion of the control circuit 110 is shown in FIG. 3. In one particular embodiment, the system 100 (FIG. 1) or the circuit breaker 105 (FIG. 1) is configured to carry 115 $V_{rms}$, at 400 Hz, and 270 A (maximum). If the RMS Current is 270 A, then the peak-to-peak current is 763.68 A. The control circuit 110 may be configured to trip the relay (e.g., break the circuit) if the DC offset current (or DC component) exceeds 2 A. The system 100, however, may be configured for different parameter values. Moreover, it should be understood that the illustrated embodiment is just one example of how the control circuit 110 may be designed and that the illustrated embodiment may be modified or designed in other manners. For example, the control circuit 110 is described as having a plurality of discrete sub-circuits. It should be understood that one or more the sub-circuits may be combined or partially overlap with one another in other embodiments.

As shown, the current sensor 112 is configured to detect an AC component and a DC component. The current sensor 112 may be positioned, for example, 1.0 millimeter (mm)

from a bus bar. When 270 A of AC is flowing through the bus bar, the magnetic field generated by the AC component is 763.68 Gauss (G). When 2 A of DC offset current, the magnetic field generated by the DC component is 4 G. An example of the current sensor 112 may be an Allegro A1325 linear hall sensor configured at 3.125 mV/G. The current sensor 112 may be formed with or coupled to an integrated circuit. At this sensitivity, the magnetic field generated by the AC component may cause a peak amplitude of 2.39 V, and the magnetic field of the DC component may cause a peak amplitude at 12.5 mV. Although 12.5 mV is small compared to 2.39 V, the AC component may be filtered (e.g., blocked) by the control circuit 110.

Again, the parameter values described herein are merely provided as examples, and the current sensor 112 and the control circuit 110 may be configured to operate within different parameters.

In the illustrated embodiment, the sensor output is received by a filter sub-circuit 114, which is a low-pass filter. Various filter sub-circuits may be used in other embodiments. As shown, the filter sub-circuit 114 includes first and second stages, but a different number of stages may be used. The filter sub-circuit 114 has a predetermined cut-off frequency. In the above example, the frequency of the AC is 400 Hz, which may be significantly blocked by the filter sub-circuit 114. The filter sub-circuit 114 provides a filtered output.

Turning to FIG. 3, the control circuit 110 may include a re-conditioning sub-circuit 116. In the illustrated embodiment, the current sensor 112 is configured such that an output from the sensor (referred to as sensor output) may have a designated base voltage when no magnetic field is detected. When a strong positive magnetic field is detected, the sensor output may be close to a designated maximum voltage. When a strong negative magnetic field is detected, the sensor output may be close to a designated minimum voltage. In the example shown by the illustrated embodiment, the filtered output may have a designated maximum voltage of about 5V and a designated minimum voltage of about 2.5 V.

In the illustrated embodiment, the re-conditioning circuit 116 includes multiple stages 118, 120. In a first stage 118, the filtered output is modified by a designated amount. More specifically, the filtered output is subtracted by 2.5 V. During a second stage 120, a gain is applied to the modified filtered output. For example, the modified filtered output from the first stage 118 is multiplied by a factor (e.g., 200). The modified filtered output from the first stage 118 may range from 0 to 12.5 mV. Using the factor of 200, when the DC component is zero, the modified filtered output from the second stage 120 is zero. When the DC component is 2 A, however, then the modified filtered output from the second stage is 2.5 V. This gained output (or the modified filtered output from the second stage 120) may be easier to analyze by the analysis sub-circuit 122.

Although the illustrated embodiment includes the re-conditioning circuit 116 having two stages, it should be understood that the re-conditioning circuit 116 may have a different number of stages. Moreover, it should be understood that the re-conditioning circuit 116 is only optional. In other embodiments, the filtered output from the filter sub-circuit 114 may be directly conveyed to the analysis sub-circuit 122.

As shown, the modified filtered output from the second stage 120 is communicated to the analysis sub-circuit 122.

In the illustrated embodiment, the analysis sub-circuit 122 includes a comparator 124 with hysteresis and trimmer to set trip current.

Figure 4:
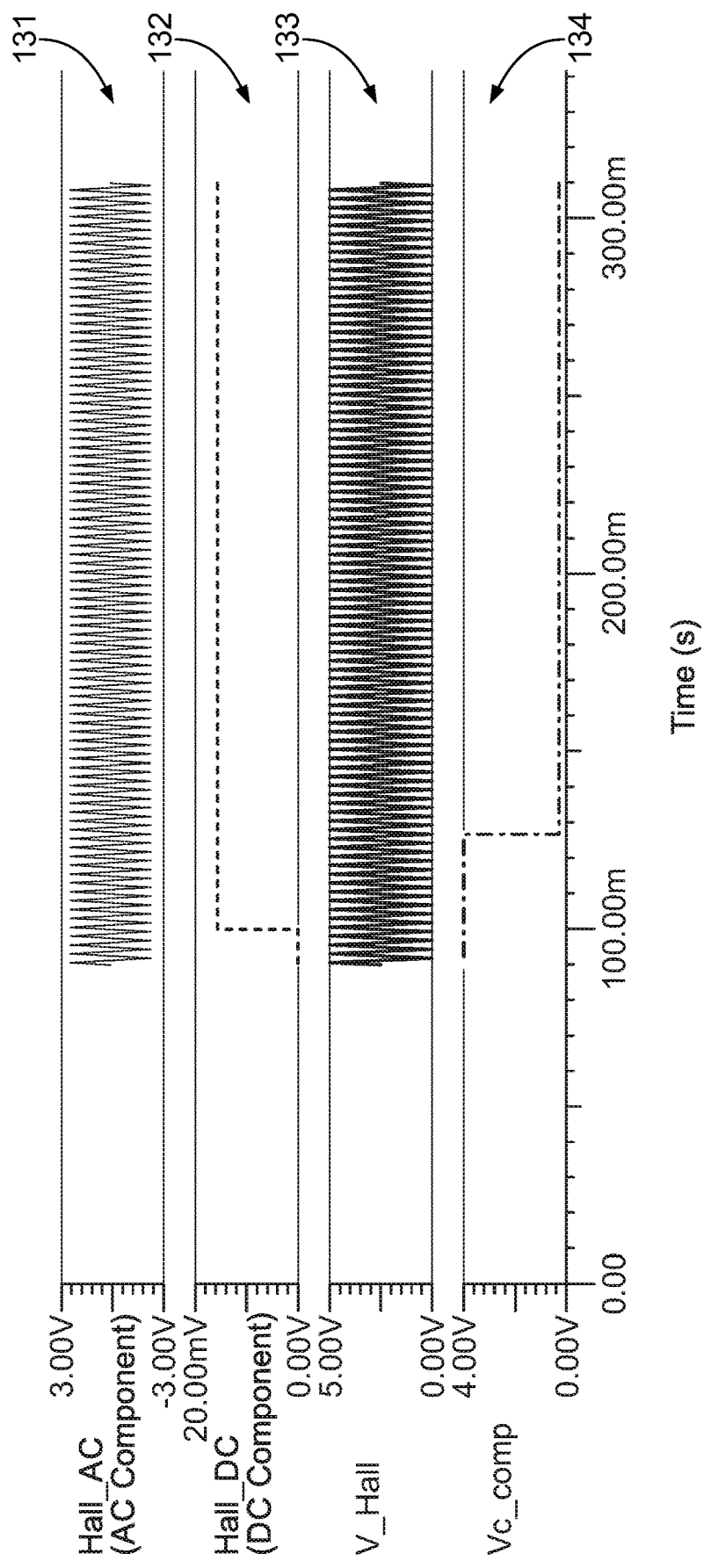
FIG. 4 is a graph illustrating a relationship among various elements of the control circuit during operation of the system of FIG. 1.
Figure 5:
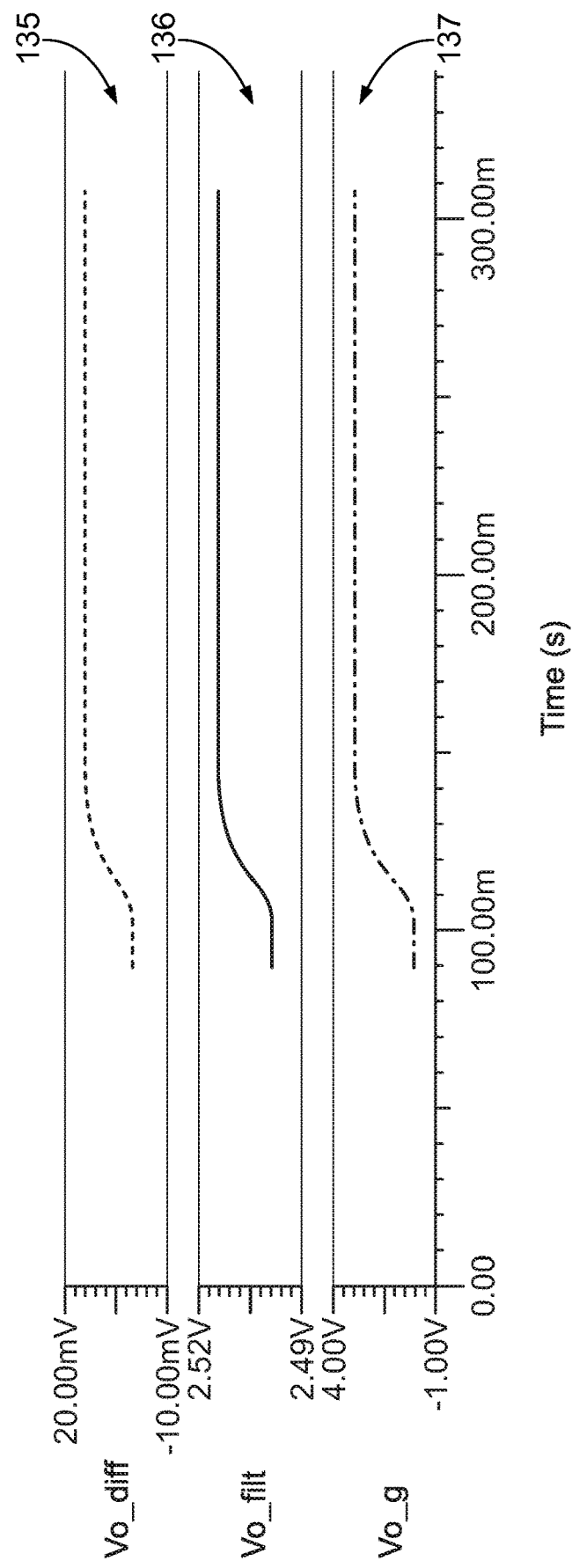
FIG. 5 is a graph illustrating a relationship among various elements of the control circuit during operation of the system of FIG. 1.

FIGS. 4 and 5 include graphs illustrating a relationship among various elements of the control circuit 110 (FIG. 1) during operation of the system 100 (FIG. 1). In FIG. 4, graph 131 shows a voltage of the AC component as detected by the current sensor 112. Graph 132 shows a voltage of the DC component as detected by the current sensor 112. Graph 133 shows a voltage of the current sensor 112 at point 143 in FIG. 2, which is the voltage that is communicated to the filter sub-circuit 114. This may be referred to as the sensor output. The voltage of the current sensor 112 is the sum of the AC component, the DC component, and a predetermined value or offset (e.g., 2.5 V). Graph 134 shows a voltage of the comparator 124 at point 144. In FIG. 5, graph 136 shows a voltage of the filter sub-circuit 118 at point 146. The voltage at point 146 is the voltage of the current sensor 112 with the AC component removed. This may be referred to as the DC output. This DC output may be subsequently modified by one or more stages of the re-conditioning sub-circuit 116 (e.g., the stages 118, 120). Alternatively, the DC output may be directly analyzed by the analysis sub-circuit 122.

Graph 135 shows a voltage at point 145 of the second stage 120. The voltage at point 145 is the filtered voltage minus a designated offset (e.g., 2.5V) applied by the first stage 118. Graph 137 shows a voltage after the second stage 120 at point 147 (e.g., after applying the gain).

As shown in FIGS. 4 and 5, the power line 104 (FIG. 1) has a steady state at 90 milliseconds (ms). The control circuit 110 in this example is configured to trip when the DC component exceeds 12.5 mV. As shown, one or more fault events may occur at about 100 ms that cause a DC offset current to be injected into the power line 104. The DC offset current causes the DC component in the current sensor 112 to abruptly change. As shown by the graph 132, the DC component may change from about 0 mV to about 17.5 mV, which exceeds 12.5 mV. The voltage of the current sensor at 143 raises by about 17.5 mV.

The voltage at point 146 begins to rise at about 103 ms, and the voltages at points 145 and 147 begin to rise immediately thereafter. At about 127 or 128 ms, the voltage at the point 144 drops from about 3.70 V to about 0.3 V.

When a threshold voltage 148 is exceeded, the control circuit 110 may activate the contactor (or contactors) 106 thereby tripping the relay. Alternatively or in addition to tripping the relay, the control circuit 110 may communicate the state to the operator. In some cases, the DC component may be communicated. In such cases, the precise value may be communicated (e.g., 2.3 A) or a severity of how much the DC component exceeded may be communicated. For example, lights may be color-coded so that a user knows to what extent the DC component has exceeded the threshold.

In some embodiments, the control circuit may be relatively low cost. For example, the components may only include a single Hall effect sensor, a generic quad operational amplifier (e.g., single chip), and a generic comparator. The control circuit may be robust in cases when the AC current dropped, since the DC current may be significantly lower (e.g., hundreds of amps to ten or less amps). Moreover, the filter sub-circuit may provide noise immunity. The Schmitt trigger (or hysteresis) may prevent bouncing due to remnant ripple in signal chain.

Optionally, the control circuit 110 may include a processing unit 150. The processing unit 150 may be configured to change the designated threshold based on other information. For example, if the system 100 is operating in an emergency mode, the processing unit 150 may change the designated threshold to render it more difficult to pass. The processing unit 150 may be a logic-based device that performs operations based on instructions stored on a tangible and non-transitory computer readable medium, such as memory. The processing unit 150 may also be hardwired.

In other embodiments, the processing unit 150 (or other circuitry) may change how the re-conditioning sub-circuit 116 modifies the DC output. For instance, the function of the re-conditioning sub-circuit 116 may be changed based on the operating mode. As one example, the offset applied at stage 118 or the gain applied at stage 120 may be changed based on whether the operating mode is in the standard mode or the emergency mode. As such, the re-conditioning sub-circuit 116 may modify the DC output in different manners.

Figure 6:
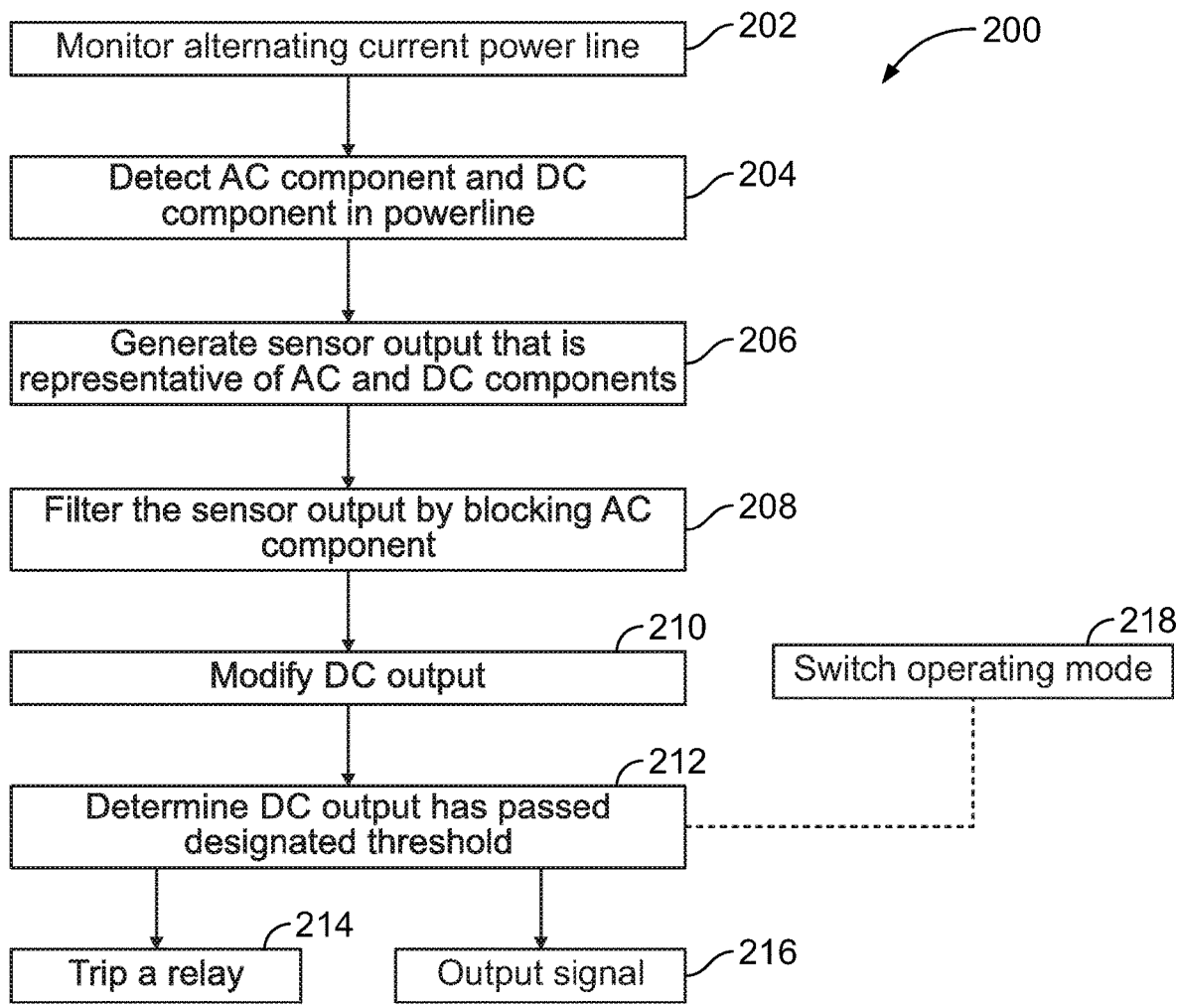
FIG. 6 is a flow chart illustrating a method in accordance with an embodiment.

FIG. 6 is a flow chart 200 illustrating a method in accordance with an embodiment. The method 200 includes monitoring, at 202, an alternating current power line that conveys power to a load. The method 200 also includes detecting, at 204, an alternating current (AC) component. After one or more fault events, a direct current (DC) offset component in the alternating current may be detected at 204. The method 200 may then include generating, at 206, a sensor output that is representative of the AC component and the DC component. The AC component has a frequency that is higher than a frequency of the DC component. The method 200 also includes filtering, at 208, the sensor output by blocking the AC component and generating a DC output that is based on the DC component.

Optionally, the method 200 may include modifying, at 210, the DC output after filtering and prior to determining whether the DC output has passed the designated threshold at 212. At 212, the method 200 may determine that the DC output has passed a designated threshold. Upon making this determination, the method 200 may at least one of trip, at 214, a relay or output, at 216, a signal.

Optionally, the method 200 may also include switching, at 218, from a standard mode to an emergency mode. The designated threshold during the standard mode may be smaller than the designated threshold during the emergency mode such that certain fault events are ignored in the emergency mode. Alternatively, the DC output may be modified in a different manner by the re-conditioning circuit. The switching, at 218, may occur at any time during the method 200. The switching, at 218, may be manually activated or may be automatically activated as described above.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A control circuit configured to monitor an alternating current power line, the control circuit comprising:
   a Hall Effect sensor configured to detect alternating current transmitted through a power line, wherein the alternating current of the power line includes an alternating current (AC) component and a direct current DC offset component;
   a filter sub-circuit configured to receive a sensor output from the Hall Effect sensor that is representative of the AC component and the DC component, the AC component having a frequency that is higher than a frequency of the DC component, the filter sub-circuit configured to block the AC component and generate a DC output that is based on the DC component without the AC component; and
   an analysis sub-circuit configured to receive the DC output from the filter sub-circuit and determine that the DC output from the filter sub-circuit has passed a designated threshold, the analysis sub-circuit configured to trip a relay or output a signal when the DC output from the filter sub-circuit passes the designated threshold.

2. The control circuit of claim 1, wherein the control circuit is configured to operate in a standard mode and in an emergency mode, the designated threshold being smaller for the standard mode than the emergency mode such that certain fault events are ignored when the control circuit is operating in the emergency mode.

3. The control circuit of claim 1, further comprising a reconditioning sub-circuit configured to modify the DC output from the filter sub-circuit prior to the DC output being received by the analysis sub-circuit.

4. A control circuit configured to monitor an alternating current power line, the control circuit comprising:
   a current sensor configured to detect alternating current transmitted through a power line, wherein the alternating current of the power line includes an alternating current (AC) component and a direct current DC offset component;
   a filter sub-circuit configured to receive a sensor output from the current sensor that is representative of the AC component and the DC component, the AC component having a frequency that is higher than a frequency of the DC component, the filter sub-circuit configured to block the AC component and generate a DC output that is based on the DC component; and
   an analysis sub-circuit configured to receive the DC output from the filter sub-circuit and determine that the DC output from the filter sub-circuit has passed a designated threshold, the analysis sub-circuit configured to trip a relay or output a signal when the DC output from the filter sub-circuit passes the designated threshold;

wherein the control circuit is configured to operate in a standard mode and in an emergency mode, further comprising a reconditioning sub-circuit modifying the DC output in a first manner during the standard mode and modifying the DC output in a second manner during the emergency mode, the DC output being modified in the emergency mode such that certain fault events are ignored when the control circuit is operating in the emergency mode.

5. The control circuit of claim 1, wherein the reconditioning sub-circuit offsets the value of the output from the filter sub-circuit by a predetermined amount.

6. The control circuit of claim 1, wherein the control circuit is configured to analyze the DC component to identify one or more fault events.

7. A system that includes the control circuit of claim 1, the system further comprising:
the alternating current power line that is configured to convey the power from the power supply to a load; and
a circuit breaker coupled to the power line wherein the analysis sub-circuit of the control circuit is configured to open a contactor or relay when the DC output from the filter sub-circuit passes the designated threshold or output the signal to an operator when the DC output from the filter sub-circuit passes the designated threshold.

8. The system of claim 7, wherein the control circuit is configured to operate in a standard mode and in an emergency mode, the designated threshold being smaller for the standard mode than the emergency mode such that certain fault events are ignored when the control circuit is operating in the emergency mode.

9. The system of claim 7, further comprising a reconditioning sub-circuit configured to modify the DC output from the filter sub-circuit prior to the DC output being received by the analysis sub-circuit.

10. The system of claim 9, wherein the control circuit is configured to operate in a standard mode and in an emergency mode, the reconditioning sub-circuit modifying the DC output in a first manner during the standard mode and modifying the DC output in a second manner during the emergency mode, the DC output being modified in the emergency mode such that certain fault events are ignored when the control circuit is operating in the emergency mode.

11. The system of claim 7, wherein the control circuit is configured to analyze the DC component to identify one or more fault events out of a plurality of fault events have occurred.

12. A method comprising:
monitoring an alternating current power line that conveys power to a load using a Hall Effect sensor;
detecting an alternating current (AC) component and a direct current (DC) offset component in the alternating current;
generating a sensor output that is representative of the AC component and the DC component, the AC component having a frequency that is higher than a frequency of the DC component;
filtering the sensor output by blocking the AC component and generating a DC output that is based on the DC component without the AC component;
determining the DC output has passed a designated threshold; and
tripping a relay or outputting a signal when the DC output passes the designated threshold.

13. The method of claim 12, further comprising switching from a standard mode to an emergency mode, the designated threshold during the standard mode being smaller than the designated threshold during the emergency mode such that certain fault events are ignored in the emergency mode.

14. The method of claim 12 further comprising modifying the DC output prior to determining the DC output has passed the designated threshold; switching from a standard mode to an emergency mode, the DC output being modified in a first manner during the standard mode and modified in a different second manner during the emergency mode, the DC output being modified in the emergency mode such that certain fault events are ignored when the control circuit is operating in the emergency mode.

15. The control circuit of claim 3, further comprising a single integrated circuit chip having the Hall Effect sensor, the reconditioning sub-circuit, and the analysis sub-circuit.

16. The control circuit of claim 1, wherein a current of the AC component is at least 100 times greater than a current of the DC component.

17. The control circuit of claim 16, wherein the power line is configured to carry 115 VAC at fixed or variable frequency.

18. The control circuit of claim 1, wherein the sensor output is a function of a designated base voltage, the designated base voltage having a value when no magnetic field is detected.

19. The system of claim 7, wherein the circuit breaker includes a single integrated circuit chip having the Hall Effect sensor and the analysis sub-circuit.

20. The system of claim 7, wherein the system includes a three-phase solar inverter, the control circuit configured to monitor undesired DC offset from an inversion process.

* * * * *